United States Patent
Hsu et al.

(10) Patent No.: US 8,737,534 B2
(45) Date of Patent: May 27, 2014

(54) RECEIVER HAVING INPHASE-QUADRATURE IMBALANCE COMPENSATION AND INPHASE-QUADRATURE IMBALANCE COMPENSATION METHOD THEREOF

(75) Inventors: Terng-Yin Hsu, Zhubei (TW); Wei-Chi Lai, Luzhu Township, Taoyuan County (TW); Shao-Ying Yeh, New Taipei (TW); Tsung-Yu Tsai, Shanhua Town (TW)

(73) Assignee: Institute for Information Industry, Taipei (TW)

( * ) Notice: Subject to any disclaimer, the term of this patent is extended or adjusted under 35 U.S.C. 154(b) by 93 days.

(21) Appl. No.: 13/443,281

(22) Filed: Apr. 10, 2012

(65) Prior Publication Data

US 2013/0216004 A1 Aug. 22, 2013

(30) Foreign Application Priority Data

Feb. 17, 2012 (TW) ............................... 101105226 A

(51) Int. Cl.
*H03D 3/00* (2006.01)
(52) U.S. Cl.
USPC ......... 375/322; 324/76.78; 375/268; 375/324

(58) Field of Classification Search
None
See application file for complete search history.

(56) References Cited

U.S. PATENT DOCUMENTS

| 2005/0238114 A1* | 10/2005 | Ishikawa et al. ............... 375/298 |
| 2006/0039506 A1* | 2/2006 | D'Alessandro ............... 375/324 |
| 2010/0134092 A1* | 6/2010 | Shimura ................... 324/76.78 |

* cited by examiner

*Primary Examiner* — Adolf Dsouza
(74) *Attorney, Agent, or Firm* — Greer, Burns & Crain, Ltd.

(57) ABSTRACT

A receiver having Inphase-Quadrature (I-Q) imbalance compensation and an I-Q imbalance compensation method are provided. The receiver calculates a cross-ratio parameter according to a first ideal receiving value and a first ideal conjugate receiving mirror of a first receiving signal and a second ideal receiving value and a second ideal conjugate receiving mirror of a second receiving signal. The receiver calculates an I-Q imbalance compensation parameter according to the cross-ratio parameter, the first ideal receiving value, the first ideal conjugate receiving mirror, the second ideal receiving value, the second ideal conjugate receiving mirror, the first receiving signal and the second receiving signal. The receiver compensates a third receiving signal according to the I-Q imbalance compensation parameter.

12 Claims, 2 Drawing Sheets

RECEIVER HAVING INPHASE-QUADRATURE IMBALANCE COMPENSATION AND INPHASE-QUADRATURE IMBALANCE COMPENSATION METHOD THEREOF

This application claims priority to Taiwan Patent Application No. 101105226 filed on Feb. 17, 2012, which is hereby incorporated by reference in its entirety.

CROSS-REFERENCES TO RELATED APPLICATIONS

Not applicable.

BACKGROUND

1. Field of the Invention

The present invention relates to a receiver having Inphase-Quadrature (I-Q) imbalance compensation and an I-Q imbalance compensation method thereof. More particularly, the present invention relates to a receiver having I-Q imbalance compensation and an I-Q imbalance compensation method thereof that feature a low computational complexity and a short latency.

2. Descriptions of the Related Art

In response to modern people's desires for high-speed wireless transmission, wireless communication systems incapable of high-speed transmission have been gradually rejected in the market and, naturally, having a high-speed transmission function has become an essential requirement on future wireless communication systems. For the purpose of high-speed wireless transmission, oscillating frequencies of radio-frequency (RF) oscillators must be increased correspondingly. However, as the oscillating frequencies of the RF oscillators increase, the Inphase-Quadrature (I-Q) imbalance effect of the oscillators also becomes more serious.

The so-called I-Q imbalance refers to a phenomenon that an imbalance in amplitude and/or in phase exists between the I-Q channels. Because the I-Q imbalance would seriously affect the performances of wireless communication systems, it is difficult for a wireless communication system without I-Q imbalance compensation to provide desirable communication quality.

Conventional I-Q imbalance compensation methods are generally divided into the following two categories:

(1) methods that accomplish the detection and the compensation by use of known time-domain or frequency-domain preamble signals or pilot signals; and (2) methods that accomplish the compensation by use of a time-domain filter.

However, the methods of the first category are known to have a great computational complexity, which tends to cause a large amount of hardware resource waste; and the methods of the second category are known to have a long latency, which tends to cause a long waiting time.

Accordingly, an urgent need exists in the art to provide an I-Q imbalance compensation method that features a low computational complexity and a short latency to compensate the I-Q imbalance effect incurred in the existing wireless communication systems that pursue high-speed wireless transmission.

SUMMARY

The objective of the present invention is to provide a receiver having Inphase-Quadrature (I-Q) imbalance compensation and an I-Q imbalance compensation method thereof. More specifically, the present invention calculates an I-Q imbalance compensation parameter according to a cross-ratio difference between two known signals with the same frequency, and then compensates an I-Q imbalance for a subsequent receiving signal according to the I-Q imbalance compensation parameter. Based on the cross-ratio difference, the I-Q imbalance compensation method of the present invention can compensate for the I-Q imbalance at a low computational complexity and with a short latency, so the problems with the conventional I-Q imbalance compensation methods suffering from either a great computational complexity or a long latency can be effectively solved.

To achieve the aforesaid objective, the present invention provides a receiver having I-Q imbalance compensation. The receiver comprises a calculation unit and a compensation unit electrically connected to the calculation unit.

The calculation unit is configured to execute the following operations: calculating a first ratio of a first ideal conjugate receiving mirror to a first ideal receiving value of a first receiving signal, the first receiving signal having a frequency; calculating a second ratio of a second ideal conjugate receiving mirror to a second ideal receiving value of a second receiving signal, the second receiving signal having the frequency; calculating a cross-ratio parameter, the cross-ratio parameter being a third ratio of the first ratio to the second ratio, the third ratio being a value, the value being unequal to zero and one; and calculating an I-Q imbalance compensation parameter according to the cross-ratio parameter, the first ideal receiving value, the first ideal conjugate receiving mirror, the second ideal receiving value, the second ideal conjugate receiving mirror, the first receiving signal and the second receiving signal.

The compensation unit is configured to compensate a third receiving signal according to the I-Q imbalance compensation parameter, wherein the third receiving signal has the frequency.

To achieve the aforesaid objective, the present invention further provides an I-Q imbalance compensation method for use in a receiver. The receiver comprises a calculation unit and a compensation unit electrically connected to the calculation unit. The I-Q imbalance compensation method comprises the following steps:

(1) calculating a first ratio of a first ideal conjugate receiving mirror to a first ideal receiving value of a first receiving signal by the calculation unit, the first receiving signal having a frequency;

(2) calculating a second ratio of a second ideal conjugate receiving mirror to a second ideal receiving value of a second receiving signal by the calculation unit, the second receiving signal having the frequency;

(3) calculating a cross-ratio parameter by the calculation unit, the cross-ratio parameter being a third ratio of the first ratio to the second ratio, the third ratio being a value, the value being unequal to zero and one;

(4) calculating an I-Q imbalance compensation parameter by the calculation unit according to the cross-ratio parameter, the first ideal receiving value, the first ideal conjugate receiving mirror, the second ideal receiving value, the second ideal conjugate receiving mirror, the first receiving signal and the second receiving signal; and (5) compensating a third receiving signal by the compensation unit according to the I-Q imbalance compensation parameter, the third receiving signal having the frequency.

The detailed technology and preferred embodiments implemented for the subject invention are described in the following paragraphs accompanying the appended drawings for people skilled in this field to well appreciate the features of the claimed invention.

DESCRIPTION DESCRIPTION

In the following descriptions, the present invention will be explained with reference to embodiments thereof. However, these embodiments are not intended to limit the present invention to any specific environment, applications or particular implementations described in these embodiments. Therefore, the description of these embodiments is only for the purpose of illustration rather than to limit the present invention. It should be appreciated that in the following embodiments and the attached drawings, elements unrelated to the present invention are omitted from depiction; and dimensional relationships among individual elements in the attached drawings are illustrated only for ease of understanding, but not to limit the actual scale.

Figure 1:
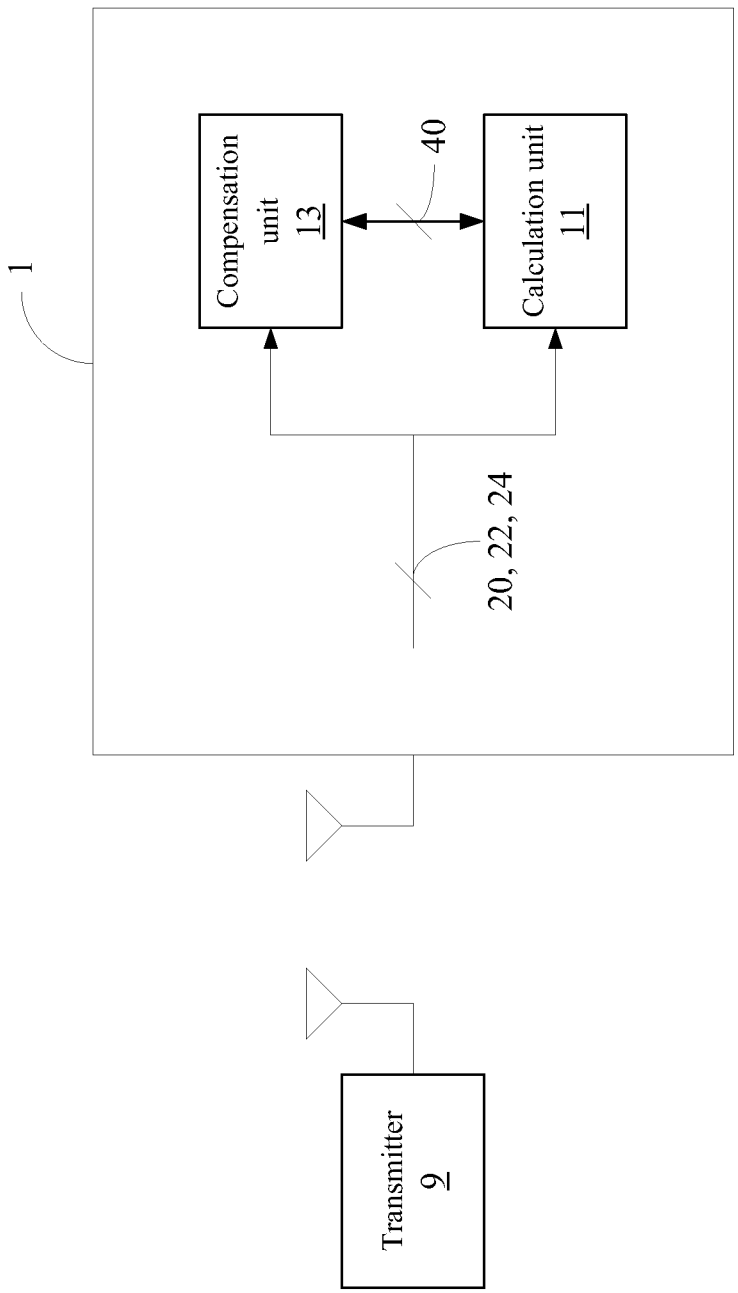
FIG. 1 is a schematic view of a receiver 1 according to the first embodiment of the present invention.

The first embodiment of the present invention is a receiver 1 having I-Q imbalance compensation. FIG. 1 is a schematic view of the receiver 1. As shown in FIG. 1, the receiver 1 comprises a calculation unit 11 and a compensation unit 13 electrically connected with the calculation unit 11. For the purpose of simplicity, units, components or modules such as the receiving unit, the decoding unit and the time-domain/frequency-domain converting unit are omitted from depiction in the receiver 1 of this embodiment.

In this embodiment, the receiver 1 is configured to receive signals from a transmitter 9. Specifically, the receiver 1 receives from the transmitter 9 a first receiving signal 20, a second receiving signal 22 and a third receiving signal 24. However, the receiver 1 may receive more signals from the transmitter 9 in other embodiments.

In this embodiment, the first receiving signal 20, the second receiving signal 22 and the third receiving signal 24 have the same frequency. The first receiving signal 20 and the second receiving signal 22 are synchronization signals. However, the first receiving signal 20 and the second receiving signal 22 may be preamble signals, pilot signals or other signals known to the receiver 1 in other embodiments.

Because synchronization signals, preamble signals or pilot signals are signals known to the receiver 1, the receiver can learn a first ideal receiving value 20a and a first ideal conjugate receiving mirror 20b of the first receiving signal 20, and a second ideal receiving value 22a and a second ideal conjugate receiving minor 22b of the second receiving signal 22. The first ideal receiving value 20a represents a positive frequency component of the first receiving signal 20 before being transmitted by the transmitter 9 (i.e., a positive frequency component that has not been subjected to various noises, interferences and channel attenuations). The first ideal conjugate receiving mirror 20b represents the conjugate of a negative frequency component of the first receiving signal 20 before being transmitted by the transmitter 9 (i.e., a negative frequency component that has not been subjected to various noises, interferences and channel attenuations).

Likewise, the second ideal receiving value 22a represents a positive frequency component of the second receiving signal 22 before being transmitted by the transmitter 9. The second ideal conjugate receiving mirror 22b represents the conjugate of a negative frequency component of the second receiving signal 22 before being transmitted by the transmitter 9.

After the first signal 20 is received by the receiver 1 from the transmitter 9, the calculation unit 11 calculates a first ratio of the first ideal conjugate receiving minor 20b to the first ideal receiving value 20a of the first receiving signal 20. Additionally, after the second signal 22 is received by the receiver 1 from the transmitter 9, the calculation unit 11 calculates a second ratio of the second ideal conjugate receiving mirror 22b to the second ideal receiving value 22a of the second receiving signal 22. Then, the calculation unit 11 calculates a cross-ratio parameter, which is a third ratio of the first ratio to the second ratio.

Under the condition that the cross-ratio parameter is a value which is unequal to zero and one, the calculation unit 11 calculates an I-Q imbalance compensation parameter 40 according to the cross-ratio parameter, the first ideal receiving value 20a, the first ideal conjugate receiving mirror 20b, the second ideal receiving value 22a, the second ideal conjugate receiving mirror 22b, the first receiving signal 20 and the second receiving signal 22. Next, after the I-Q imbalance compensation parameter 40 is provided by the calculation unit 11 to the compensation unit 13, the compensation unit 13 compensates a third receiving signal 24 according to the I-Q imbalance compensation parameter 40 so that the I-Q imbalance effect is eliminated for the third receiving signal 24.

It shall be appreciated that the receiver 1 of this embodiment is suitable for use in various wireless communication systems and, preferably, for use in an Orthogonal Frequency-Division Multiplexing (OFDM) system. Therefore, hereinafter, an OFDM system will be taken as an exemplary example to further describe why the receiver 1 of this embodiment has the advantages of a low computational complexity and a short latency. In this example, both the receiver 1 and the transmitter 9 conform to an OFDM standard.

For the purpose of description, it is firstly assumed that the channels have no influence on signals. Then, in the OFDM system, a baseband signal with a frequency and received by an antenna may be represented as the following equation after a process of fast Fourier transformed (FFT):

$$R_3(k) = I_3(k) + jQ_3(k) \qquad (1)$$
$$= \alpha Z_3(k) + \beta Z_3^*(-k)$$
$$\alpha = \frac{(1 + ge^{-j\theta})}{2}$$
$$\beta = \frac{(1 - ge^{-j\theta})}{2}$$

where, $R_3(k)$ represents the third receiving signal 24, $I_3(k)$ represents a component of the I-channel in the I-Q channels, $Q_3(k)$ represents a component of the Q channel in the I-Q channels, $Z_3(k)$ represents a third ideal receiving value 24a of the third receiving signal 24, $Z_3^*(-k)$ represents a third ideal conjugate receiving mirror 24b of the third receiving signal 24, g represents an amplitude error between the I-Q channels, $\theta$ represents a phase error between the I-Q channels, and k represents the frequency.

On the other hand, according to Equation (1), the conjugate receiving mirror of the third receiving signal 24 may be further represented as the following equation:

$$R_3^*(-k) = \alpha^* Z_3^*(-k) + \beta^* Z_3(k) \qquad (2)$$
$$\alpha = \frac{(1 + ge^{-j\theta})}{2}$$
$$\beta = \frac{(1 - ge^{-j\theta})}{2}$$

where, $R_3^*(-k)$ represents the conjugate receiving mirror of the third receiving signal 24, $Z_3(k)$ represents the third ideal receiving value 24a of the third receiving signal 24, $Z_3^*(-k)$ represents the third ideal conjugate receiving mirror 24b of the third receiving signal 24, g represents an amplitude error between the I-Q channels, θ represents a phase error between the I-Q channels, $\alpha^*$ represents the conjugate of α, $\beta^*$ represents the conjugate of β, and k represents the frequency.

Hence, on the basis of Equation (1) and Equation (2), the compensation unit 13 can compensate the third receiving signal 24 according to the following equation:

$$GZ_3(k) = R_3(k) - DR_3^*(-k) \quad (3)$$
$$G = \alpha(1 - DD^*)$$
$$D = \frac{\beta}{\alpha^*}$$

where, G represents a gain, $Z_3(k)$ represents the third ideal receiving value 24a of the third receiving signal 24, $R_3(k)$ represents the third receiving signal 24, D represents the I-Q imbalance compensation parameter 40, $D^*$ represents the conjugate of D, $R_3^*(-k)$ represents a third conjugate receiving mirror of the third receiving signal 24, and k represents the frequency.

For the receiver 1, the gain G is a value that can be removed because the gain G has no influence on the compensation of the I-Q imbalance. As an example, the gain G may be removed through processing by a decoding unit, an equalization unit (not shown) or the like of the receiver 1. Thus, the compensation unit 13 can obtain the third ideal receiving value 24a of the third receiving signal 24 simply by subtracting a product of the conjugate receiving mirror of the third receiving signal 24 and the I-Q imbalance compensation parameter 40 from the third receiving signal 24. In other words, the compensation unit 13 can compensate the I-Q imbalance effect of the third receiving signal 24 simply through one subtraction operation and one multiplication operation, so the computational complexity and the computational burden can be significantly reduced.

With respect to the I-Q imbalance, the receiver 1 has the advantages of easing the computational complexity and reducing the computational burden not only in the compensation process but also in the process of calculating the I-Q imbalance compensation parameter 40. Specifically, it is unnecessary for the receiver 1 to calculate specific values of α and β respectively and then calculate the I-Q imbalance compensation parameter 40 according to the specific values of α and β.

The method in which the receiver 1 calculates the I-Q imbalance compensation parameter 40 will be further described hereinafter. If the influence of the channels on signals is to be considered in the OFDM system, then the first receiving signal 20 and the first conjugate receiving mirror thereof may be represented according to Equation (1) and Equation (2) as follows:

$$R_1(k) = Z_1(k)\left[\alpha H(k) + \beta H^*(-k)\frac{Z_1^*(-k)}{Z_1(k)}\right] \quad (4)$$

$$R_1^*(-k) = Z_1^*(-k)\left[\alpha^* H^*(-k) + \beta^* H(k)\frac{Z_1(k)}{Z_1^*(-k)}\right] \quad (5)$$

where, $R_1(k)$ represents the first receiving signal 20, $R_1^*(-k)$ represents the first conjugate receiving mirror of the first receiving signal 20, $Z_1(k)$ represents the first ideal receiving value 20a of the first receiving signal 20, $Z_1^*(-k)$ represents the first ideal conjugate receiving mirror 20b of the first receiving signal 20, H(k) represents a channel response, $H^*(-k)$ represents a conjugate mirror of the channel response, and k represents the frequency.

Similarly, according to Equation (1) and Equation (2), the second receiving signal 22 and the second conjugate receiving mirror thereof may be represented as follows:

$$R_2(k) = Z_2(k)\left[\alpha H(k) + \beta H^*(-k)\frac{Z_2^*(-k)}{Z_2(k)}\right] \quad (6)$$

$$R_2^*(-k) = Z_2^*(-k)\left[\alpha^* H^*(-k) + \beta^* H(k)\frac{Z_2(k)}{Z_2^*(-k)}\right] \quad (7)$$

where, $R_2(k)$ represents the second receiving signal 22, $R_2^*(-k)$ represents the second conjugate receiving mirror of the second receiving signal 22, $Z_2(k)$ represents the second ideal receiving value 22a of the second receiving signal 22, $Z_2^*(-k)$ represents the second ideal conjugate receiving mirror 22b of the second receiving signal, H(k) represents a channel response, $H^*(-k)$ represents the conjugate mirror of the channel response, and k represents the frequency.

Since the first receiving signal 20 and the second receiving signal 22 are known to the receiver 1, $Z_1(k)$, $Z_1^*(-k)$, $Z_2(k)$ and $Z_2^*(-k)$ are known to the receiver 1. Additionally, since the first receiving signal 20 and the second receiving signal 22 have the same frequency, the channel responses H(k) on each of the receiving signals are the same. Therefore, there are four unknown variables in the simultaneous linear equations formed by the Equations (4) to (7), namely, α, β, H(k) and $H^*(-k)$.

Although values of α and β can be obtained by performing an inverse matrix operation on the simultaneous linear equations formed by Equations (4) to (7), the inverse matrix operation has a great computational complexity and will lead to a considerable increase in the computational burden. Therefore, the receiver 1 of this embodiment obtains the I-Q imbalance compensation parameter 40 not through the direct calculation of the specific values of α and β. Instead, the I-Q imbalance compensation parameter 40 is calculated in the following way.

Specifically, by simplifying the simultaneous linear equations formed by Equations (4) to (7), the I-Q imbalance compensation parameter 40 may be represented as:

$$D = \frac{\beta}{\alpha^*} \quad (8)$$
$$= \frac{[1 - CRI^*(-k)]}{[CRI(k) - 1]} \times$$
$$\frac{R_1(k) \times \frac{Z_2(k)}{Z_1(k)} - R_2(k)}{R_1^*(-k) \times \frac{Z_2^*(-k)}{Z_1^*(-k)} - R_2^*(-k) \times CRI^*(-k)}$$

$$CRI(k) = \frac{\left[\frac{Z_1^*(-k)}{Z_1(k)}\right]}{\left[\frac{Z_2^*(-k)}{Z_2(k)}\right]}$$

where, D represents the I-Q imbalance compensation parameter 40, CRI(k) represents the cross-ratio parameter, and $CRI^*(-k)$ represents the conjugate mirror of CRI(k).

Then, as can be known from Equation (8), it is unnecessary to firstly obtain the specific values of α and β in calculation of the I-Q imbalance compensate parameter 40 (i.e., D). Instead, the I-Q imbalance compensate parameter 40 may be calculated according to the cross-ratio parameter CRI(k), the first ideal receiving value 20a (i.e., $Z_1(k)$), the first ideal conjugate receiving mirror 20b (i.e., $Z_1^*(-k)$), the second ideal receiving value 22a (i.e., $Z_2(k)$), the second ideal conjugate receiving mirror 22b (i.e., $Z_2^*(-k)$), the first receiving signal 20 (i.e., $R_1(k)$) and the first conjugate receiving mirror thereof (i.e., $R_1^*(-k)$), as well as the second receiving signal 22 (i.e., $R_2(k)$) and the second conjugate receiving mirror thereof (i.e., $R_2^*(-k)$) that are already known.

It shall be appreciated that an essential condition that the cross-ratio parameter CRI(k) shall be a numerical value which is unequal to zero and 1 must be satisfied when it is desired to calculate the I-Q imbalance compensate parameter 40 according to Equation (8). Since the essential condition can be easily satisfied, the designers of various wireless communication systems can readily design two signals satisfying this condition. For example, the primary synchronization signal (PSS) and the secondary synchronization signal (SSS) in the Long Term Evolution (LTE) system naturally satisfy the aforesaid essential condition.

As can be known from the above descriptions, when the condition that the cross-ratio parameter CRI(k) shall be a value which is unequal to zero and 1 is satisfied, the calculation unit 11 of the receiver 1 can readily calculate the I-Q imbalance compensation parameter 40 according to Equation (8); and the compensation unit 13 of the receiver 1 can readily compensate the I-Q imbalance effect according to Equation (3).

The second embodiment of the present invention is an I-Q imbalance compensation method for use in a receiver. The receiver comprises a calculation unit and a compensation unit electrically connected to the calculation unit. It shall be appreciated that the receiver may be the receiver 1 of the first embodiment, and the calculation unit and the compensation unit may be the calculation unit 11 and the compensation unit 13 of the receiver 1 of the first embodiment respectively. In reference to FIG. 2, the flowchart diagram of this embodiment is shown therein.

Figure 2:
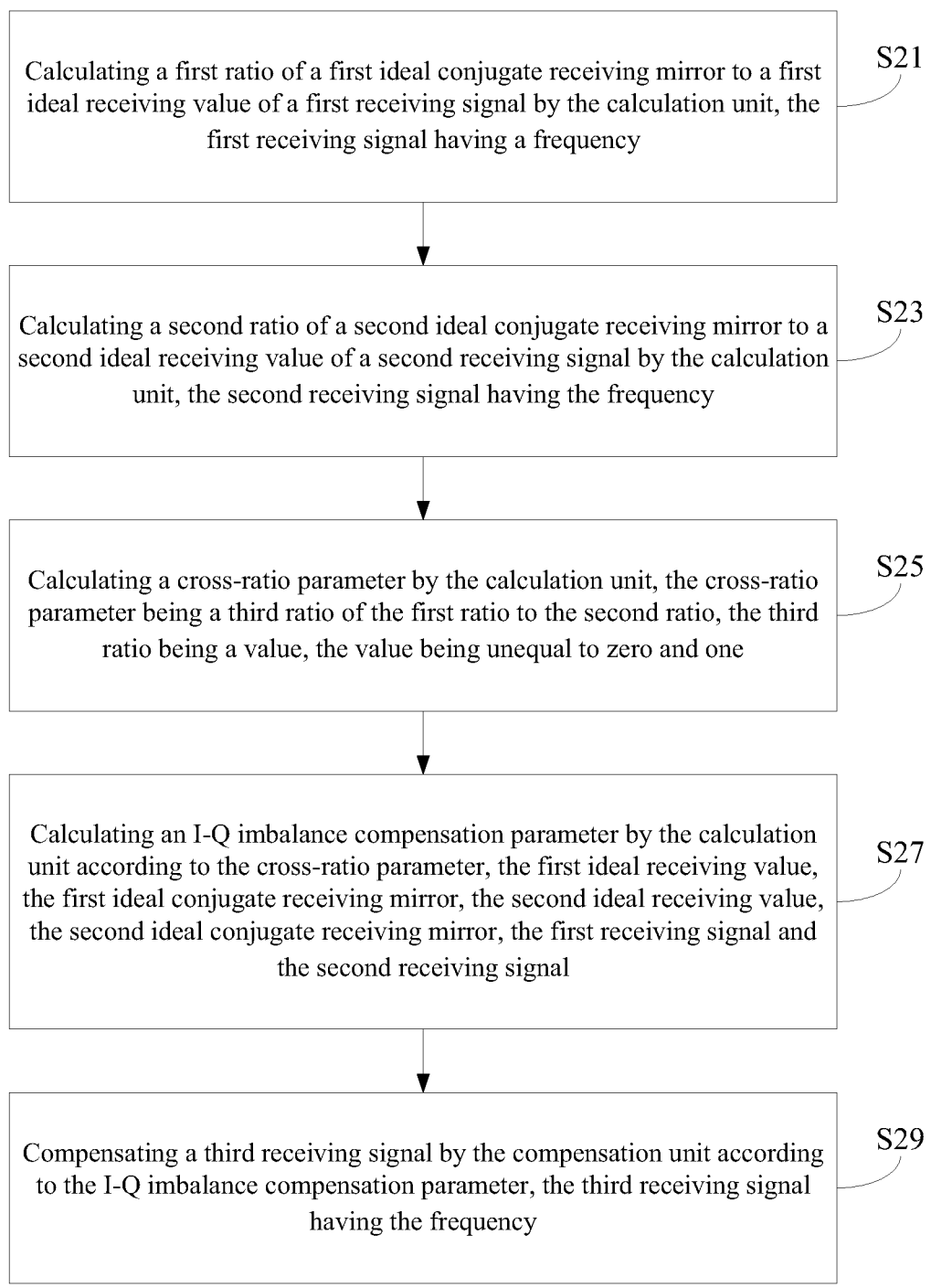
FIG. 2 is a flowchart diagram of the second embodiment of the present invention.

As shown in FIG. 2, in step S21, a first ratio of a first ideal conjugate receiving mirror to a first ideal receiving value of a first receiving signal is calculated by the calculation unit. The first receiving signal has a frequency. In step S23, a second ratio of a second ideal conjugate receiving mirror to a second ideal receiving value of a second receiving signal is calculated by the calculation unit. The second receiving signal has the frequency. In step S25, a cross-ratio parameter is calculated by the calculation unit. The cross-ratio parameter is a third ratio of the first ratio to the second ratio, and the third ratio is a value which is unequal to zero and one.

In step S27, an I-Q imbalance compensation parameter is calculated by the calculation unit according to the cross-ratio parameter, the first ideal receiving value, the first ideal conjugate receiving mirror, the second ideal receiving value, the second ideal conjugate receiving mirror, the first receiving signal and the second receiving signal. Finally, in step S29, a third receiving signal is compensated by the compensation unit according to the I-Q imbalance compensation parameter. The third receiving signal has the frequency.

In addition to the aforesaid steps, the second embodiment can also execute all the operations and functions set forth in the first embodiment. The method in which the second embodiment executes these operations and functions will be readily appreciated by those of ordinary skill in the art based on the explanation of the first embodiment, and thus, will not be further described herein.

According to the above descriptions, the receiver having I-Q imbalance compensation and the I-Q imbalance compensation method thereof according to the present invention calculate an I-Q imbalance compensation parameter according to the cross-ratio difference between two known signals with the same frequency, and then compensate an I-Q imbalance for a subsequent receiving signal according to the I-Q imbalance compensation parameter. Based on the cross-ratio difference, the I-Q imbalance compensation method of the present invention can compensate for the I-Q imbalance at a low computational complexity and with a short latency, so the problems with conventional I-Q imbalance compensation methods suffering from either a great computational complexity or a long latency can be effectively solved.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A receiver having Inphase-Quadrature (I-Q) imbalance compensation, comprising:
a calculation unit, being configured to execute the following operations:
calculating a first ratio of a first ideal conjugate receiving mirror to a first ideal receiving value of a first receiving signal, the first receiving signal having a frequency;
calculating a second ratio of a second ideal conjugate receiving mirror to a second ideal receiving value of a second receiving signal, the second receiving signal having the frequency;
calculating a cross-ratio parameter, the cross-ratio parameter being a third ratio of the first ratio to the second ratio, the third ratio being a value, the value being unequal to zero and one; and
calculating an I-Q imbalance compensation parameter according to the cross-ratio parameter, the first ideal receiving value, the first ideal conjugate receiving mirror, the second ideal receiving value, the second ideal conjugate receiving mirror, the first receiving signal and the second receiving signal; and
a compensation unit, being electrically connected to the calculation unit and configured to compensate a third receiving signal according to the I-Q imbalance compensation parameter, the third receiving signal having the frequency.

2. The receiver as claimed in claim 1, wherein the compensation unit compensates the third receiving signal according to the following equation:

$$GZ_3(k)=R_3(k)-DR_3^*(-k)$$

wherein G is a gain, $Z_3(k)$ is a third ideal receiving value of the third receiving signal, $R_3(k)$ is the third receiving signal, D is the I-Q imbalance compensation parameter, $R_3^*(-k)$ is a third conjugate receiving mirror of the third receiving signal, and k is the frequency.

3. The receiver as claimed in claim 2, wherein the cross-ratio parameter is defined as:

$$CRI(k) = \frac{\left[\frac{Z_1^*(-k)}{Z_1(k)}\right]}{\left[\frac{Z_2^*(-k)}{Z_2(k)}\right]}$$

wherein CRI(k) is the cross-ratio parameter, $Z_1(k)$ is the first ideal receiving value, $Z_1^*(-k)$ is the first ideal conjugate receiving mirror, $Z_2(k)$ is the second ideal receiving value, $Z^*_2(-k)$ is the second ideal conjugate receiving mirror.

4. The receiver as claimed in claim 3, wherein the I-Q imbalance compensation parameter is defined as:

$$D = \frac{[1 - CRI^*(-k)]}{[CRI(k) - 1]} \times \frac{R_1(k) \times \frac{Z_2(k)}{Z_1(k)} - R_2(k)}{R_1^*(-k) \times \frac{Z_2^*(-k)}{Z_1^*(-k)} - R_2^*(-k) \times CRI^*(-k)}$$

wherein D is the I-Q imbalance compensation parameter, $R_1(k)$ is the first receiving signal, $R_1^*(-k)$ is a first conjugate receiving mirror of the first receiving signal, $R_2(k)$ is the second receiving signal, and $R_2^*(-k)$ is a second conjugate receiving mirror of the second receiving signal.

5. The receiver as claimed in claim 1, wherein each of the first receiving signal and the second receiving signal is one of a preamble signal, a synchronization signal and a pilot signal.

6. The receiver as claimed in claim 1, wherein the receiver conforms to an Orthogonal Frequency-Division Multiplexing (OFDM) standard.

7. An I-Q imbalance compensation method for use in a receiver, the receiver comprising a calculation unit and a compensation unit electrically connected to the calculation unit, the I-Q imbalance compensation method comprising the following steps:
(a) calculating a first ratio of a first ideal conjugate receiving mirror to a first ideal receiving value of a first receiving signal by the calculation unit, the first receiving signal having a frequency;
(b) calculating a second ratio of a second ideal conjugate receiving mirror to a second ideal receiving value of a second receiving signal by the calculation unit, the second receiving signal having the frequency;
(c) calculating a cross-ratio parameter by the calculation unit, the cross-ratio parameter being a third ratio of the first ratio to the second ratio, the third ratio being a value, the value being unequal to zero and one;
(d) calculating an I-Q imbalance compensation parameter by the calculation unit according to the cross-ratio parameter, the first ideal receiving value, the first ideal conjugate receiving mirror, the second ideal receiving value, the second ideal conjugate receiving mirror, the first receiving signal and the second receiving signal; and
(e) compensating a third receiving signal by the compensation unit according to the I-Q imbalance compensation parameter, the third receiving signal having the frequency.

8. The I-Q imbalance compensation method as claimed in claim 7, wherein the compensation unit compensates the third receiving signal according to the following equation:

$$GZ_3(k) = R_3(k) - DR_3^*(-k)$$

wherein G is a gain, $Z_3(k)$ is a third ideal receiving value of the third receiving signal, $R_3(k)$ is the third receiving signal, D is the I-Q imbalance compensation parameter, $R_3^*(-k)$ is a third conjugate receiving mirror of the third receiving signal, and k is the frequency.

9. The I-Q imbalance compensation method as claimed in claim 8, wherein the cross-ratio parameter is defined as:

$$CRI(k) = \frac{\left[\frac{Z_1^*(-k)}{Z_1(k)}\right]}{\left[\frac{Z_2^*(-k)}{Z_2(k)}\right]}$$

wherein CRI(k) is the cross-ratio parameter, $Z_1(k)$ is the first ideal receiving value, $Z_1^*(-k)$ is the first ideal conjugate receiving mirror, $Z_2(k)$ is the second ideal receiving value, and $Z_2^*(-k)$ is the second ideal conjugate receiving mirror.

10. The I-Q imbalance compensation method as claimed in claim 9, wherein the I-Q imbalance compensation parameter is defined as:

$$D = \frac{[1 - CRI^*(-k)]}{[CRI(k) - 1]} \times \frac{R_1(k) \times \frac{Z_2(k)}{Z_1(k)} - R_2(k)}{R_1^*(-k) \times \frac{Z_2^*(-k)}{Z_1^*(-k)} - R_2^*(-k) \times CRI^*(-k)}$$

wherein D is the I-Q imbalance compensation parameter, $R_1(k)$ is the first receiving signal, $R_1^*(-k)$ is a first conjugate receiving mirror of the first receiving signal, $R_2(k)$ is the second receiving signal, and $R_2^*(-k)$ is a second conjugate receiving mirror of the second receiving signal.

11. The I-Q imbalance compensation method as claimed in claim 7, wherein each of the first receiving signal and the second receiving signal is one of a preamble signal, a synchronization signal and a pilot signal.

12. The I-Q imbalance compensation method as claimed in claim 7, wherein the receiver conforms to an Orthogonal Frequency-Division Multiplexing (OFDM) standard.

* * * * *